United States Patent
Tanaka et al.

(10) Patent No.: US 7,376,010 B2
(45) Date of Patent: May 20, 2008

(54) NONVOLATILE SEMICONDUCTOR MEMORY DEVICE HAVING PROTECTION FUNCTION FOR EACH MEMORY BLOCK

(75) Inventors: Tomoharu Tanaka, Yokohama (JP);
Koichi Kawai, Yokohama (JP);
Khandker N. Quader, Sunnyvale, CA (US)

(73) Assignees: Kabushiki Kaisha Toshiba, Tokyo (JP); SanDisk Corporation, Sunnyvale, CA (US)

( * ) Notice: Subject to any disclaimer, the term of this patent is extended or adjusted under 35 U.S.C. 154(b) by 8 days.

(21) Appl. No.: 11/387,818

(22) Filed: Mar. 24, 2006

(65) Prior Publication Data

US 2006/0164886 A1 Jul. 27, 2006

Related U.S. Application Data

(63) Continuation of application No. PCT/JP2004/012419, filed on Aug. 23, 2004.

(30) Foreign Application Priority Data

Sep. 26, 2003 (JP) ............... 2003-336058

(51) Int. Cl.
*G11C 16/04* (2006.01)
*G11C 7/00* (2006.01)
(52) U.S. Cl. .................. 365/185.04; 365/195
(58) Field of Classification Search ........... 365/185.04
See application file for complete search history.

(56) References Cited

U.S. PATENT DOCUMENTS

| | | | | |
|---|---|---|---|---|
| 5,592,641 | A * | 1/1997 | Fandrich et al. ............ 711/103 |
| 5,749,088 | A * | 5/1998 | Brown et al. ............... 711/115 |
| 5,812,446 | A * | 9/1998 | Tailliet ................... 365/185.04 |
| 5,991,197 | A | 11/1999 | Ogura et al. |
| 6,031,757 | A * | 2/2000 | Chuang et al. ........ 365/185.04 |
| 6,490,197 | B1 * | 12/2002 | Fasoli .................... 365/185.04 |
| 6,600,676 | B2 | 7/2003 | Shibata et al. |
| 7,093,091 | B2 * | 8/2006 | DeCaro ...................... 711/163 |
| 7,210,012 | B2 * | 4/2007 | Lee et al. ................... 711/163 |
| 7,243,199 | B2 * | 7/2007 | Oikawa et al. ............. 711/163 |
| 2002/0002654 | A1 | 1/2002 | Ichiro |
| 2003/0126513 | A1 | 7/2003 | Sylvie |
| 2004/0059883 | A1 * | 3/2004 | Oikawa et al. ............. 711/163 |
| 2004/0177216 | A1 * | 9/2004 | Asari et al. ................. 711/103 |
| 2005/0068842 | A1 * | 3/2005 | Tominaga ................... 365/232 |
| 2006/0133155 | A1 * | 6/2006 | Fujita et al. ........... 365/185.29 |

FOREIGN PATENT DOCUMENTS

| | | |
|---|---|---|
| JP | 5-109293 | 4/1993 |
| JP | 10-106275 | 4/1998 |
| JP | 2001-35176 | 2/2001 |
| JP | 2002-109893 | 4/2002 |

* cited by examiner

*Primary Examiner*—Son L. Mai
(74) *Attorney, Agent, or Firm*—Oblon, Spivak, McClelland, Maier & Neustadt, P.C.

(57) ABSTRACT

A nonvolatile semiconductor memory device includes a memory cell array constituted by a plurality of memory blocks, an interface, a write circuit, and a read circuit. A protect flag is written in the memory block. The readout protect flag can be output to an external device through the interface. When a write command is input from the interface, the write circuit executes the write command when the protect flag in the selected memory block has a first value and does not execute the write command when the protect flag has a second value.

7 Claims, 13 Drawing Sheets

NONVOLATILE SEMICONDUCTOR MEMORY DEVICE HAVING PROTECTION FUNCTION FOR EACH MEMORY BLOCK

CROSS-REFERENCE TO RELATED APPLICATIONS

This is a Continuation Application of PCT Application No. PCT/JP2004/012419, filed Aug. 23, 2004, which was published under PCT Article 21(2) in English.

This application is based upon and claims the benefit of priority from prior Japanese Patent Application No. 2003-336058, filed Sep. 26, 2003, the entire contents of which are incorporated herein by reference.

BACKGROUND OF THE INVENTION

1. Field of the Invention

The present invention relates to an electrically programmable nonvolatile semiconductor memory device and, more particularly, to a flash memory which has a protection function of protecting each memory block from a rewrite or erase.

2. Description of the Related Art

A flash memory changes the threshold voltage by changing the charge amount of the floating gate of a memory cell transistor (erase/write operation) and accordingly stores data. For example, a negative threshold voltage is made to correspond to binary 1. A positive threshold voltage is made to correspond to binary 0.

Flash memories have been developed as ROMs in which data can be electrically rewritten. They are recently changing their position to a replacement for magnetic storage media represented by NAND flash memories. Examples of such memory devices are a flash memory card serving as a storage medium for a digital still camera or a flash memory serving as a storage element for user data in a cellular phone.

In line with progress in information technology, how to ensure security is attracting a great deal of attention. For example, a challenge in introducing a charging/payment system using a cellular phone is to prevent any alteration of the basic information of that system. In this case, partial data in the NAND flash memory must be prevented from being altered.

In the NAND flash memory, a read/write for each page (e.g., 528 bytes) and an erase for each block (constructed by a plurality of pages) are executed. In a system (e.g., a memory card) using such a NAND flash memory, file data is often managed for each memory block. For this reason, in many NAND flash memory systems, file information in each memory block is read after power-on. A file management table is created in a cache memory or the like, and then the NAND flash memory is controlled.

On the other hand, NOR flash memories still maintain the position of electrically programmable data ROMs. Some NOR flash memories have a protection function of protecting each memory block from a write or erase. However, as blocks to be protected are actually fixed, the NOR flash memories have no protection function as a replacement for magnetic storage media.

Jpn. Pat. Appln. KOKAI Publication No. 10-106275 discloses a ferroelectric memory which can set write inhibition/permission for a plurality of blocks. According to this prior art, since a ROM section and RAM section with write protection can freely be set, any setting error due to system runaway or the like can be prevented.

As described above, various proposals have been made for conventional nonvolatile semiconductor memory devices to ensure security in their memory structures. There are however no sufficiently effective measures in the chip size, operation speed, and convenience for users, and further improvement is demanded.

BRIEF SUMMARY OF THE INVENTION

According to one aspect of the present invention, there is provided a nonvolatile semiconductor memory device comprising a plurality of memory blocks constituted by electrically programmable nonvolatile semiconductor memory cells, a memory cell array constituted by the plurality of memory blocks, an interface that communicates with an external device, a write circuit to write data in a selected memory block in accordance with an address and a data write command input to the interface, when the write command is input from the interface, the write circuit executing the write command when a protect flag in the selected memory block has a first value and not executing the write command when the protect flag has a second value, and a read circuit which reads, in accordance with the address input to the interface, the protect flag that is stored in a part of the selected memory block, the protect flag read by the read circuit being able to be output to the external device through the interface.

According to another aspect of the present invention, there is provided a nonvolatile semiconductor memory device comprising a plurality of memory blocks constituted by electrically programmable nonvolatile semiconductor memory cells, a memory cell array constituted by the plurality of memory blocks, an interface that communicates with an external device, an erase circuit to erase data in a selected memory block in accordance with an address and an erase command input to the interface, when the erase command is input from the interface, the erase circuit executing the erase command when a protect flag in the selected memory block has a first value and not executing the erase command when the protect flag has a second value, and a read circuit which reads, in accordance with the address input to the interface, the protect flag that is stored in a part of the selected memory block, the protect flag read by the read circuit being able to be output to the external device through the interface.

According to still another aspect of the present invention, there is provided a nonvolatile semiconductor memory device comprising a plurality of memory blocks constituted by electrically programmable nonvolatile semiconductor memory cells, a memory cell array constituted by the plurality of memory blocks, an interface that communicates with an external device, and a write circuit to write data in a selected memory block in accordance with an address and a data write command input to the interface and write a protect flag in the selected memory block in accordance with an address and a protect flag write command input to the interface, the write circuit reading the protect flag of the selected block before the data is written in the selected block, executing the write command when the protect flag has a first value, and not executing the write command when the protect flag has a second value.

According to still another aspect of the present invention, there is provided a nonvolatile semiconductor memory device comprising a plurality of memory blocks constituted by electrically programmable nonvolatile semiconductor memory cells, a memory cell array constituted by the plurality of memory blocks, an interface that communicates with an external device, an erase circuit to erase data in a selected memory block in accordance with an address and an erase command input to the interface, the erase circuit reading an erase protect flag of the selected block before the data of the selected block is erased, executing the erase command when the erase protect flag has a first value, and not executing the erase command when the protect flag has a second value, and a write circuit to write the erase protect flag in the selected memory block in accordance with the address and an erase protect flag write command input to the interface.

DETAILED DESCRIPTION OF THE INVENTION

Figure 1:
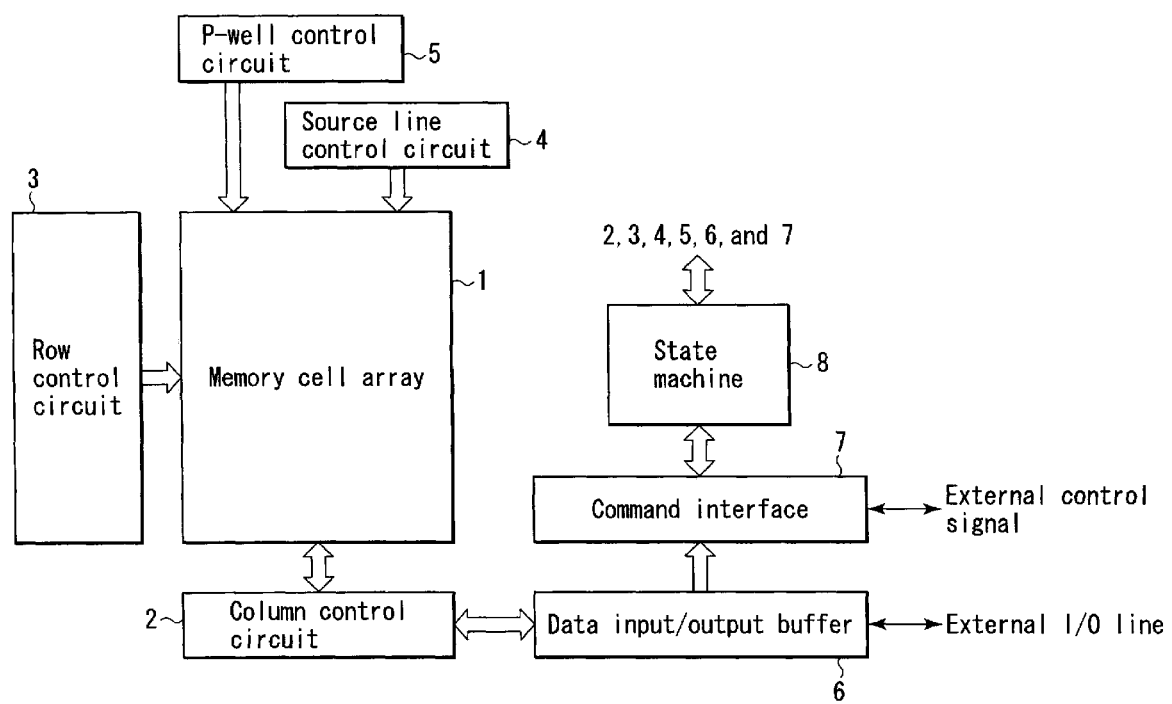
FIG. 1 is a block diagram showing the structure of a flash memory as a nonvolatile semiconductor memory device according to the embodiment of the present invention.

FIG. 1 is a block diagram showing the structure of a flash memory as a nonvolatile semiconductor memory device according to the embodiment of the present invention. A NAND flash memory is illustrated as an example, and a main part related to the protection function is shown.

A memory cell array 1 is constructed by arraying flash memory cells in a matrix. A column control circuit 2 is arranged adjacent to the memory cell array 1. The column control circuit 2 controls the bit lines of the memory cell array 1 to execute a data erase, data write, or data read for the memory cells. A row control circuit 3 is arranged to select a word line of the memory cell array 1 and apply a voltage necessary for the erase, write, or read to the word line. In addition, a source line control circuit 4 which controls the source line of the memory cell array 1 and a p-well control circuit 5 which controls the p-type well in which the memory cell array 1 is formed are arranged.

A data input/output buffer 6 is connected to an external host (not shown) through an I/O line to receive write data, output readout data, and receive address data or command data. The data input/output buffer 6 sends received write data to the column control circuit 2 and receives read data from the column control circuit 2. Additionally, to select a memory cell, the data input/output buffer 6 sends external address data to the column control circuit 2 or row control circuit 3 through a state machine 8. Also, the data input/output buffer 6 sends command data from the host to a command interface 7.

Upon receiving a control signal from the host, the command interface 7 determines whether the data input to the data input/output buffer 6 is write data, command data, or address data. If the data is command data, it is transferred to the state machine 8 as a receive command signal.

The state machine 8 manages the entire flash memory. The state machine 8 receives a command from the host and manages the read, write, erase, and data input/output.

Figure 2:
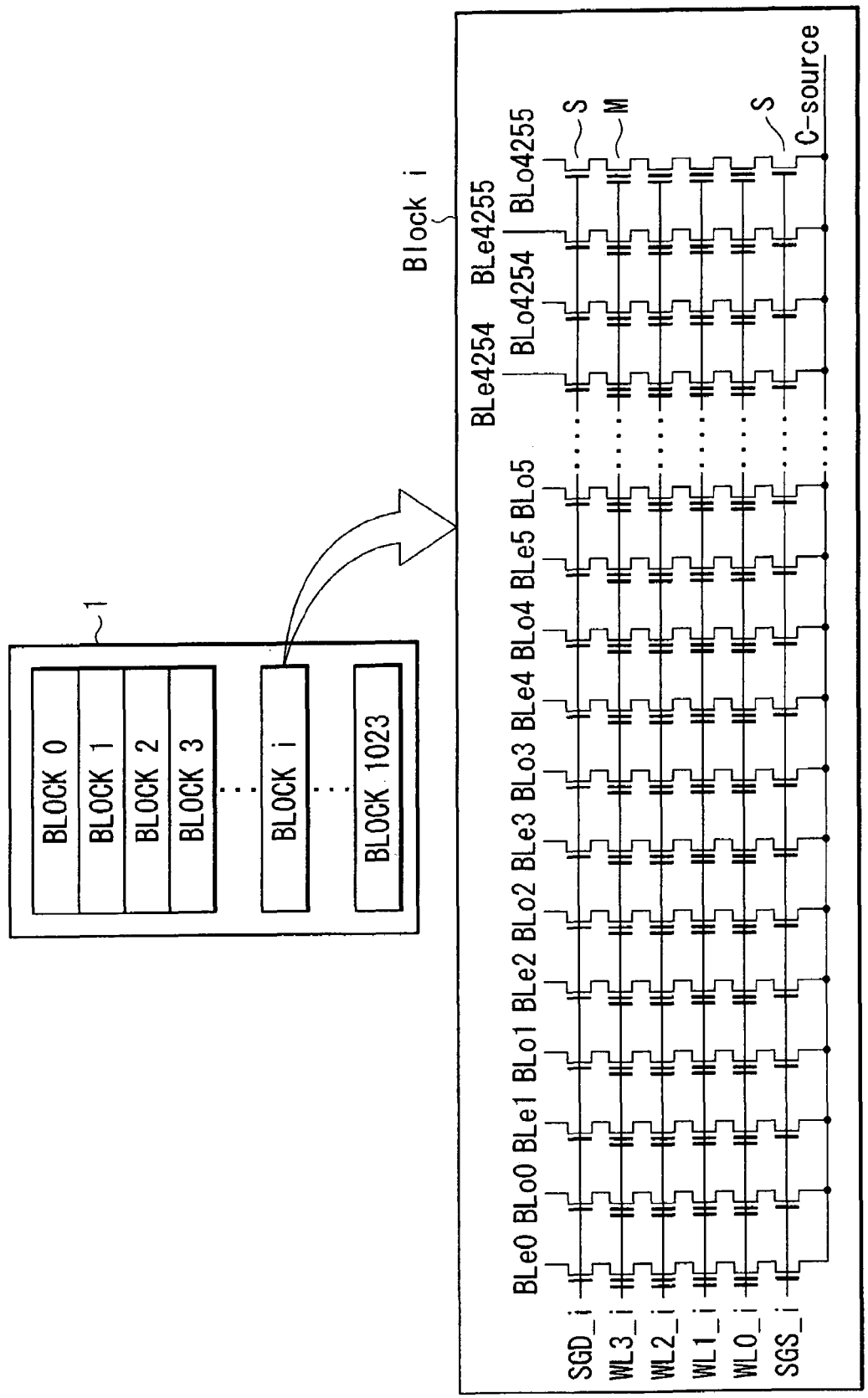
FIG. 2 is a circuit diagram showing the structure of the memory cell array shown in FIG. 1.

FIG. 2 is a circuit diagram showing the structure of the memory cell array 1. The memory cell array 1 is divided into a plurality of (1,024) memory blocks BLOCK0 to BLOCK1023. These blocks are minimum units for an erase. Each of the memory blocks BLOCK0 to BLOCK1023 is formed from 8,512 NAND memory units, as indicated by a representative memory block BLOCKi.

In this example, each NAND memory unit is constituted by connecting four memory cells M in series. One terminal of the NAND memory unit is connected to bit lines BL (BLe0 to BLe4255 and BLo0 to BLo4255) through a select gate S connected to a select gate line SGD. The other terminal of the NAND memory unit is connected to a common source line C-source through the select gate S connected to a select gate line SGS. The control gate of each memory cell M is connected to a word line WL (WL0_i to WL3_i). A data write/read is executed independently for even-numbered bit lines BLe and odd-numbered bit lines BLo counted from 0. Of the 8,512 memory cells connected to one word line WL, 4,256 memory cells are connected to the even-numbered bit lines BLe, for which the data write/read is executed simultaneously. Data of the 4,256 memory cells each storing 1-bit data constitute a unit called a page. Similarly, 4,256 memory cells connected to the odd-numbered bit lines BLo constitute another page. The data write/read is executed simultaneously for the memory cells in the page. The 4,256 memory cells in one page have a storage capacity of 532 bytes. A 1-byte area (529th-byte area) stores a write protect flag. Another byte area (530th-byte area) stores an erase protect flag. In this example, a 2-byte spare area is ensured for replacement of defective columns. Hence, the logical page length is 528 bytes.

Figure 3:
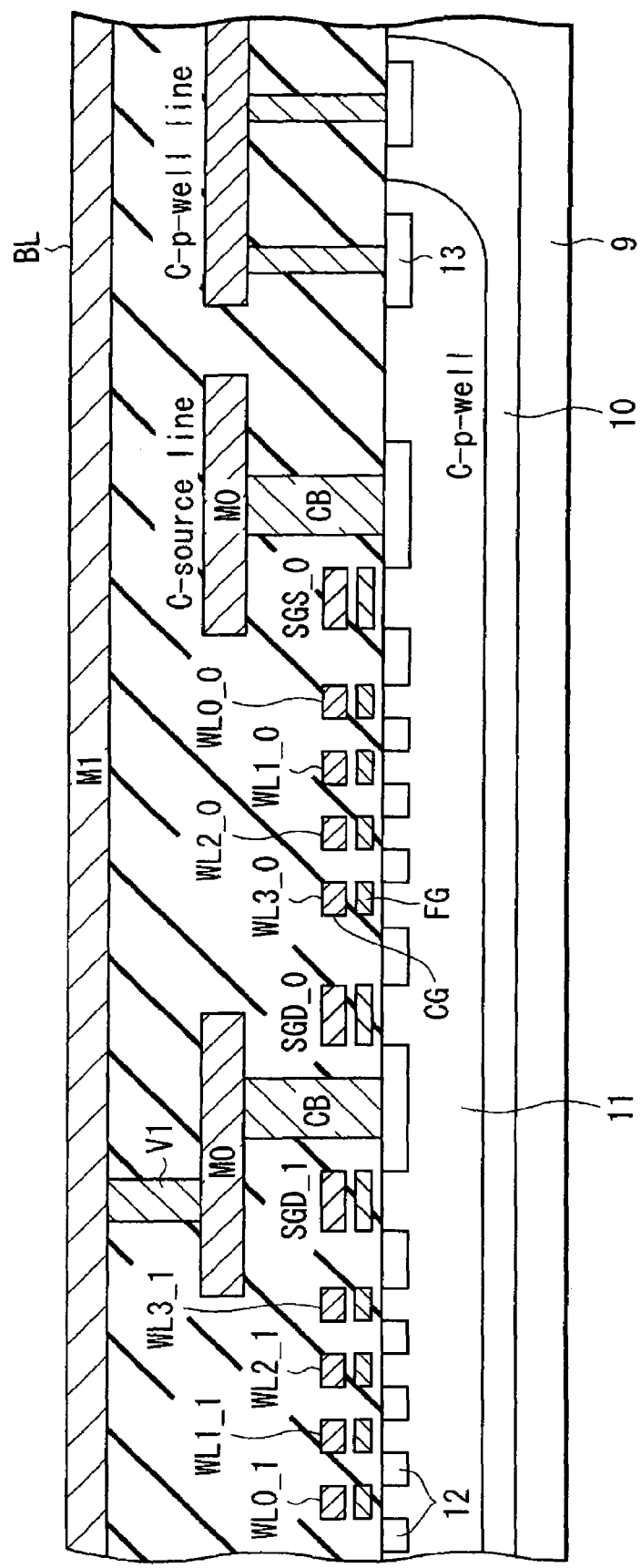
FIG. 3 is a sectional view showing the column-direction structure of the memory cell array shown in FIG. 2.

FIG. 3 is a sectional view showing the column-direction structure of the memory cell array 1. An n-type well 10 is formed in a p-type substrate 9. A p-type well 11 is formed in the n-type well 10. Each memory cell M is constituted by a source and drain formed from n-type diffusion layers 12, a floating gate FG, and a control gate CG serving as the word line WL. The select gate S is constituted by a source and drain formed from the n-type diffusion layers 12 and the select gate lines SGD (SGD_0, SGD_1, . . . ) and SGS (SGS_0, . . . ) which have a double structure and act as gates. The word line WL and select gate lines SGD and SGS are connected to the row control circuit 3 and controlled.

One terminal of the NAND memory unit is connected to a first metal interconnection layer M0 through a first contact hole CB and then connected to a second metal interconnection layer M1 serving as the bit line BL through a second contact hole V1. The bit line BL is connected to the column control circuit 2. The other terminal of the NAND memory unit is connected to the first metal interconnection layer M0 serving as the common source line C-source through the first contact hole CB. The common source line C-source is connected to the source line control circuit 4.

The n-type well 10 and p-type well 11 are set at an equipotential and connected to the p-well control circuit 5 through a well line C-p-well.

Figure 4A:
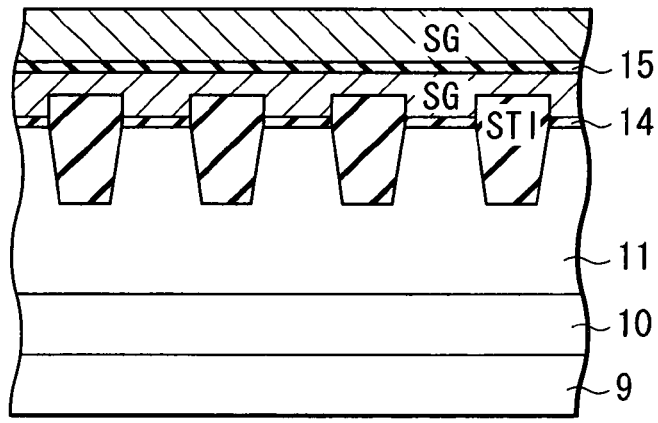
FIGS. 4A and 4B are sectional views showing the row-direction structure of the memory cell array shown in FIG. 2.
Figure 4B:
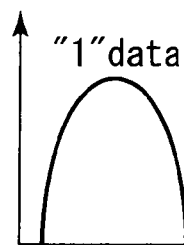

FIGS. 4A and 4B are sectional views showing the row-direction structure of the memory cell array 1. FIG. 4A shows a section corresponding to the memory cells M. FIG. 4B shows a section corresponding to the select gate S. The memory cells M are separated by an element isolation structure STI. The floating gate FG is formed on the channel region via a tunnel oxide film 14. The word line WL (control gate CG) is formed on the floating gate FG via an ONO film 15.

As shown in FIG. 4B, a select gate line SG has a double structure. The upper and lower select gate lines SG are connected at an end of the memory cell array 1 or for every predetermined number of bit lines.

Figure 5:
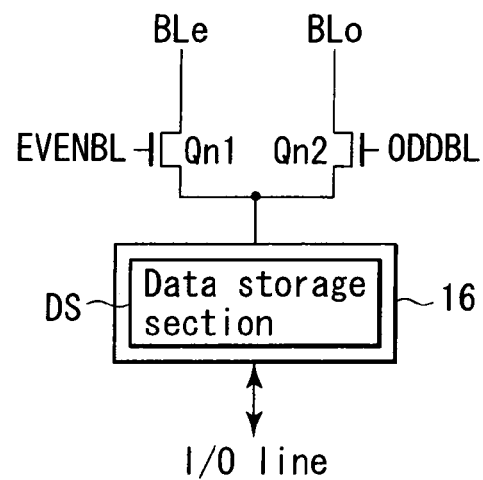
FIG. 5 is a circuit diagram showing the arrangement of the main part of the column control circuit shown in FIG. 1.

FIG. 5 shows the arrangement of the main part of the column control circuit 2 in the circuit shown in FIG. 1. A data storage circuit 16 is arranged for every two bit lines, i.e., the even-numbered bit line BLe and odd-numbered bit line BLo which have the same column number (e.g., BLe5 and BLo5). One of the bit lines is selectively connected to the data storage circuit 16 and controlled for the data write or read. When a signal EVENBL goes high, and a signal ODDBL goes low, the even-numbered bit line BLe is selected and connected to the data storage circuit 16 through an NMOS transistor Qn1. When the signal EVENBL goes low, and the signal ODDBL goes high, the odd-numbered bit line BLo is selected and connected to the data storage circuit 16 through an NMOS transistor Qn2. The signal EVENBL is common to all the even-numbered bit lines BLe. The signal ODDBL is common to all the odd-numbered bit lines BLo. Unselected bit lines BL are controlled by a circuit (not shown).

The data storage circuit 16 includes a binary data storage section DS. The data storage section DS is connected to the data input/output buffer 6 through a data input/output line (I/O line) to store write data input from an external device or read data to be output to an external device. The data storage section DS also stores a detection result when the threshold voltage of the memory cell M is confirmed after the write (write verify).

Figure 6:
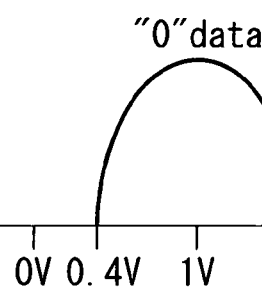
FIG. 6 is a graph showing the threshold voltage distribution of a memory transistor of the flash memory according to the embodiment of the present invention.

FIG. 6 is a graph showing the relationship between data and the threshold voltage of the memory cell M of the flash memory according to this embodiment.

After the erase, the data of the memory cell M is "1". When the write data to the memory cell M is 0, the "1" state changes to the "0" state by the write. When "1" data is written, the "1" state is maintained. When the threshold voltage is 0 V or less, the data is regarded as "1" in the read mode. When the threshold voltage is more than 0 V, the data is regarded as "0" in the read mode.

Table 1 indicates the voltages of various portions in the erase, write, read, and write verify modes. In this example, a word line WL1 and the even-numbered bit line Bte are selected in the write and read modes.

TABLE 1

|  | Erase | "0" write | "1" write | Read | Write verify |
|---|---|---|---|---|---|
| BLe | Floating | 0 V | Vdd | H or L | H or L |
| BLo | Floating | Vdd | Vdd | 0 V | 0 V |
| SGD | Floating | Vdd | Vdd | 4.5 V | 4.5 V |
| WL3 | 0 V | 10 V | 10 V | 4.5 V | 4.5 V |
| WL2 | 0 V | 10 V | 10 V | 4.5 V | 4.5 V |
| WL1 | 0 V | V pgm | V pgm | 0 V | 0.4 V |
| WL0 | 0 V | 10 V | 10 V | 4.5 V | 4.5 V |
| SGS | Floating | 0 V | 0 V | 4.5 V | 4.5 V |
| C-source | Floating | 0 V | 0 V | 0 V | 0 V |
| C-p-well | Vera | 0 V | 0 V | 0 V | 0 V |

The p-type well 11 is set to an erase voltage Vera of 20 to 21 V, and all word lines WL0 of a selected block are set to 0 V. Since electrons are discharged from the floating gate FG of the memory cell M, the threshold voltage changes to a negative voltage so the "1" state is set. The word lines and bit lines BL of unselected blocks are set in a floating state and have a value close to Vera because of capacitive coupling to the p-type well 11.

The write is executed by applying a write voltage Vpgm of 12 to 20 V to the selected word line WL1. When the selected bit line BLe is set to 0 V, electrons are injected to the floating gate FG, and the threshold voltage rises ("0" write). To inhibit the rise of the threshold voltage, the bit line BLe is set to a power supply voltage Vdd (to 3 V) (write inhibit, "1" write).

The read is executed by applying a read voltage of 0 V to the selected word line WL1. When the threshold voltage of the memory cell M is equal to or lower than the read voltage, the bit line BLe and common source line C-source are set in the conductive state, and the potential of the bit line BLe changes to relatively low level L ("1" read). When the threshold voltage of the memory cell M is higher than the read voltage, the bit line BLe and common source line C-source are set in the non-conductive state, and the potential of the bit line BLe changes to relatively high level H ("0" read).

The threshold voltage in the "0" state is set. to 0.4 V or more to ensure a read margin of 0.4 V with respect to the read voltage of 0 V. For this reason, to write "0" data, the write verify is executed. When it is detected that the threshold voltage of the memory cell M has reached 0.4 V, the write is inhibited, and the threshold voltage is controlled.

The write verify is executed by applying a verify voltage of 0.4 V to the selected word line WL1. When the threshold voltage of the memory cell M is equal to or lower than the verify voltage, the bit line BLe and common source line C-source are set in the conductive state, and the potential of the bit line BLe changes to relatively low level L. When the threshold voltage of the memory cell M is higher than the verify voltage, the bit line BLe and common source line C-source are set in the non-conductive state, and the potential of the bit line BLe changes to relatively high level H.

Figure 7:
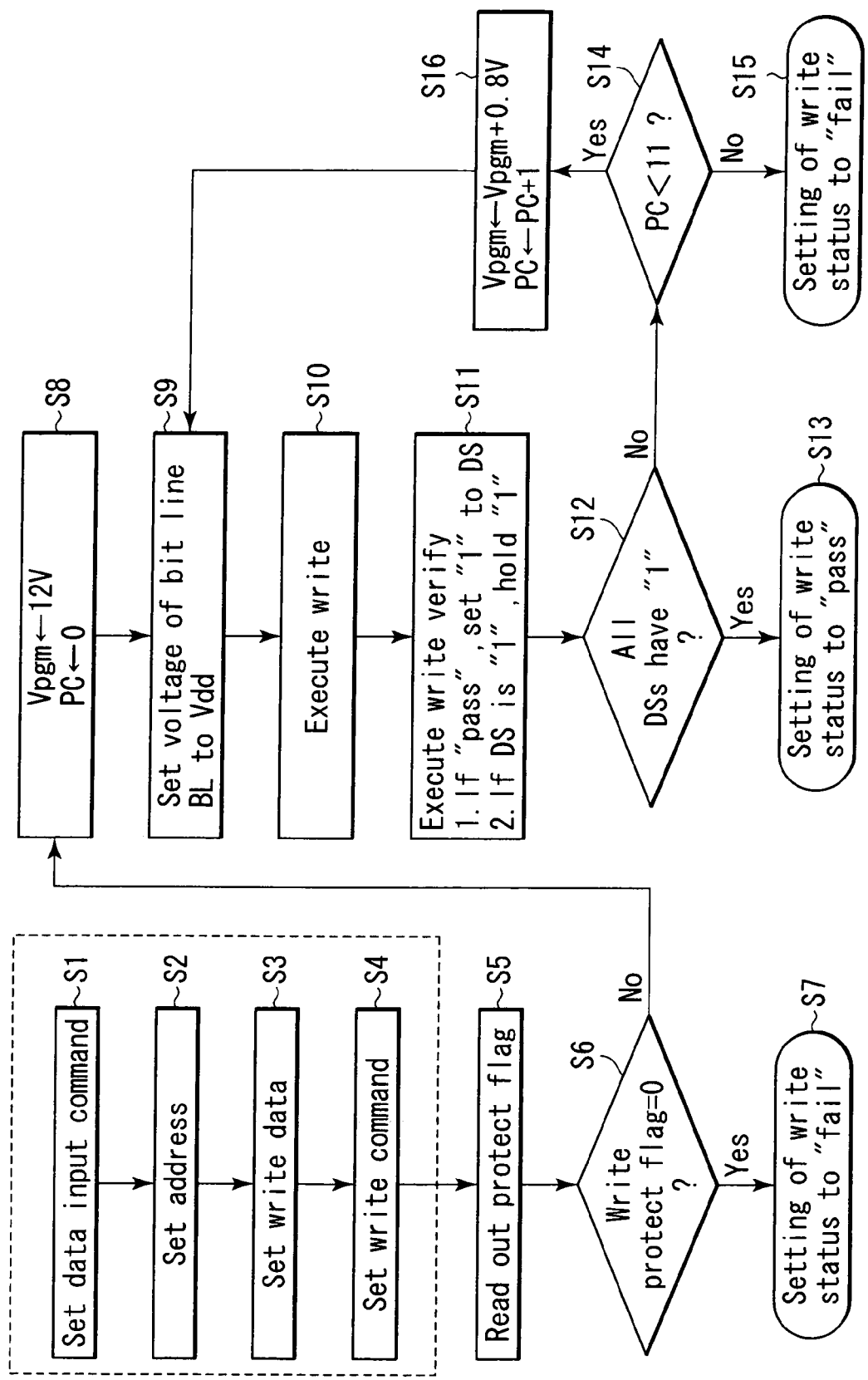
FIG. 7 is a flowchart showing the algorithm of a data write according to the embodiment of the present invention.

FIG. 7 shows the algorithm of a data write to the memory transistor M connected to the word line WL.

First, a data input command from the host is received and set in the state machine 8 (S1). Address data from the host is received, and the address to select a write page is set in the state machine 8 (S2). At this time, all the 532 bytes of the write data of the data storage sections DS are reset to "1"s. Write data corresponding to one page (528 bytes) is received, and write data corresponding to each data storage section DS is set (S3). A write command issued by the host is received and set in the state machine 8 (S4). When the write command is set, steps S5 to S16 are automatically internally activated by the state machine 8.

The page in the selected block, to which the write protect flag is to be written, is read (the page does not coincide with the page selected for the write in some cases). The write protect flag corresponding to one byte is read (S5). It is determined next whether the write protect flag is set (S6). If all the data in the memory cells M corresponding to one byte are "0"s, it is determined that the write protect flag is set. In this case, steps S8 to S16 are not executed. The write command is not executed. The write status is set to "fail", and the processing is ended (S7). If all the data in the memory cells M corresponding to one byte are "1"s, it is determined that no write protect flag is set. In this case, steps S8 to S16 are executed. When the write protect flag corresponding to one byte contains both "1" and "0", it is determined that the write protect flag is set when four or more "0" bits are present. In this way, an error generated in the write protect flag data is corrected in accordance with the majority theory.

When no write protect flag is set, steps S8 to S16 are executed. The initial value of the write voltage Vpgm is set to 12 V. A write counter PC is set to 0 (S8). When the data in the data storage section DS is "0", the write control voltage, i.e., the voltage of the bit line BL is set to 0 V. When the data in the data storage section DS is "1", the write control voltage, i.e., the voltage of the bit line BL is set to Vdd because the write is inhibited (S9). A write step is executed to apply a write pulse to the memory cells of one page by using the set write voltage Vpgm and write control voltage (S10).

The write verify is activated (S11). Data in the data storage sections DS corresponding to some of the memory transistors of one page, for which the detection results indicate "pass", are changed from "0" to "1". Memory transistors whose data storage sections DS have data "1" hold "1". It is detected whether the data in all the data storage sections DS are "1"s (S12). If YES in step S12, the write status is determined as "pass", and the processing is ended (S13). Otherwise, it is determined that the write status is not "pass". The write counter PC is checked (S14). If the value of the write counter PC is 11 or more, it is determined that the write has not been normally executed. The write status is set to "fail", and the write is ended (S15). If the value of the write counter PC is smaller than 11, the value is incremented by one. In addition, the set value of the write voltage Vpgm is increased by 0.8 V (S16). Step S9 and then the write step S10 are executed again.

Figure 8:
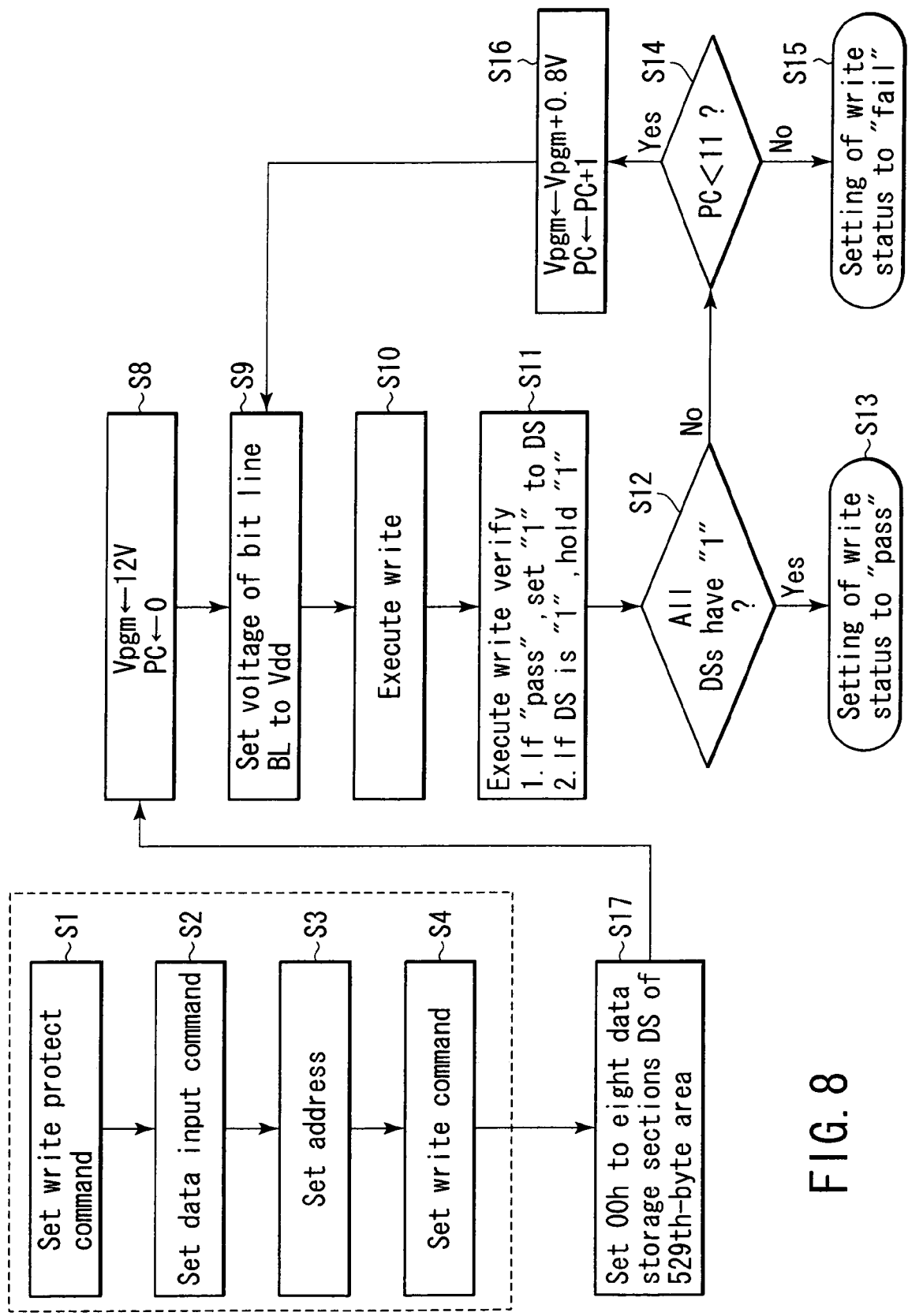
FIG. 8 is a flowchart showing the algorithm of a write protect flag write according to the embodiment of the present invention.

FIG. 8 shows the algorithm of a write protect flag write to a selected block.

First, a write protect command from the host is received and set in the state machine 8 (S1). A data input command from the host is received and set in the state machine 8 (S2). Address data from the host is received, and the address to select a write page is set in the state machine 8 (S3). At this time, all the 532 bytes of the write data of the data storage sections DS are reset to "1"s. Since the write protect flag is written in the first page of the selected block, the address is that of the first page of the selected block. The received page address may be neglected, and a page address may be automatically internally generated in accordance with the write protect command. In this case, the write protect flag is written in the page selected by the internally generated page address.

A write command issued by the host is received and set in the state machine 8 (S4). When the write command is set, steps S8 to S17 are automatically internally activated by the state machine 8.

First, 00*h* (=00000000 in binary number) is set in the eight data storage sections DS of the 529th-byte area (S17). Accordingly, 00*h* data is written only in the 529th-byte area.

Next, steps S8 to S16 are executed. The initial value of the write voltage Vpgm is set to 12 V. The write counter PC is set to 0 (S8). When the data in the data storage section DS is "0", the write control voltage, i.e., the voltage of the bit line BL is set to 0 V. When the data in the data storage section DS is "1", the write control voltage, i.e., the voltage of the bit line BL is set to Vdd because the write is inhibited (S9). A write step is executed to apply a write pulse to the memory cells of one page by using the set write voltage Vpgm and write control voltage (S10).

The write verify is activated (S11). Data in the data storage sections DS corresponding to some of the memory transistors of one page, for which the detection results indicate "pass", are changed from "0" to "1". Memory transistors whose data storage sections DS have data "1" hold "1". It is detected whether the data in all the data storage sections DS are "1"s (S12). If YES in step S12, the write status is determined as "pass", and the processing is ended (S13). Otherwise, it is determined that the write status is not "pass". The write counter PC is checked (S14). If the value of the write counter PC is 11 or more, it is determined that the write has not been normally executed. The write status is set to "fail", and the write is ended (S15). If the value of the write counter PC is smaller than 11, the value is incremented by one. In addition, the set value of the write voltage Vpgm is increased by 0.8 V (S16). Step S9 and then the write step S10 are executed again.

Figure 9:
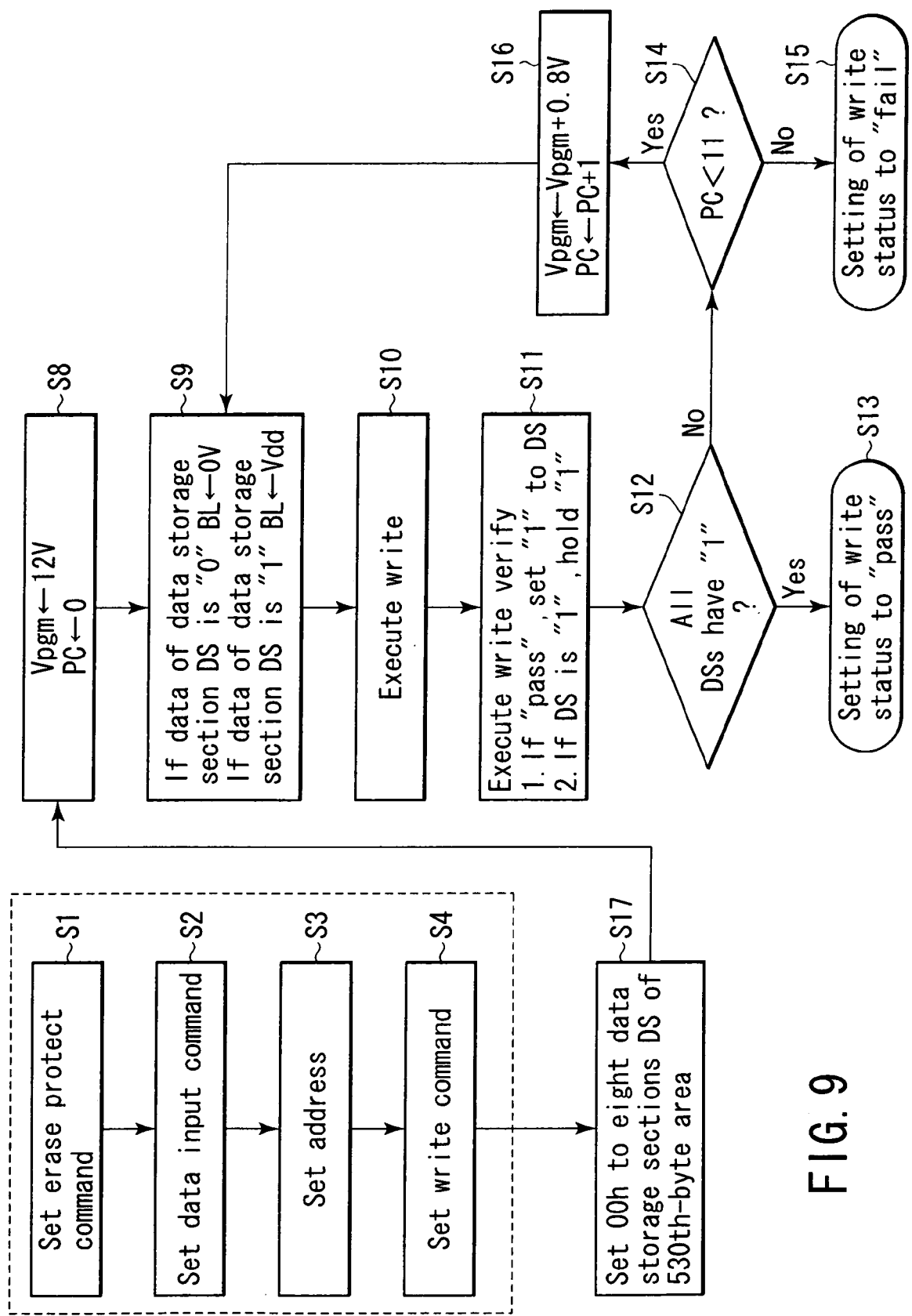
FIG. 9 is a flowchart showing the algorithm of an erase protect flag write according to the embodiment of the present invention.

FIG. 9 shows the algorithm of an erase protect flag write to a selected block.

First, an erase protect command from the host is received and set in the state machine 8 (S1). A data input command from the host is received and set in the state machine 8 (S2). Address data from the host is received, and the address to select a write page is set in the state machine 8 (S3). At this time, all the 532 bytes of the write data of the data storage sections DS are reset to "1"s. Since the erase protect flag is written in the first page of the selected block, the address is that of the first page of the selected block. The received page address may be neglected, and a page address may be automatically internally generated in accordance with the erase protect command. In this case, the erase protect flag is written in the page selected by the internally generated page address.

A write command issued by the host is received and set in the state machine 8 (S4). When the write command is set, steps S8 to S17 are automatically internally activated by the state machine 8.

First, 00*h* (=00000000 in binary number) is set in the eight data storage sections DS of the 530th-byte area (S17). Accordingly, 00*h* data is written only in the 530th-byte area.

Next, steps S8 to S16 are executed. The initial value of the write voltage Vpgm is set to 12 V. The write counter PC is set to 0 (S8). When the data in the data storage section DS is "0", the write control voltage, i.e., the voltage of the bit line BL is set to 0 V. When the data in the data storage section DS is "1", the write control voltage, i.e., the voltage of the bit line BL is set to Vdd because the write is inhibited (S9). A write step is executed to apply a write pulse to the memory cells of one page by using the set write voltage Vpgm and write control voltage (S10).

The write verify is activated (S11). Data in the data storage sections DS corresponding to some of the memory transistors of one page, for which the detection results indicate "pass", are changed from "0" to "1". Memory transistors whose data storage sections DS have data "1" hold "1". It is detected whether the data in all the data storage sections DS are "1"s (S12). If YES in step S12, the write status is determined as "pass", and the processing is ended (S13). Otherwise, it is determined that the write status is not "pass". The write counter PC is checked (S14). If the value of the write counter PC is 11 or more, it is determined that the write has not been normally executed. The write status is set to "fail", and the write is ended (S15). If the value of the write counter PC is smaller than 11, the value is incremented by one. In addition, the set value of the write voltage Vpgm is increased by 0.8 V (S16). Step S9 and then the write step S10 are executed again.

Figure 10:
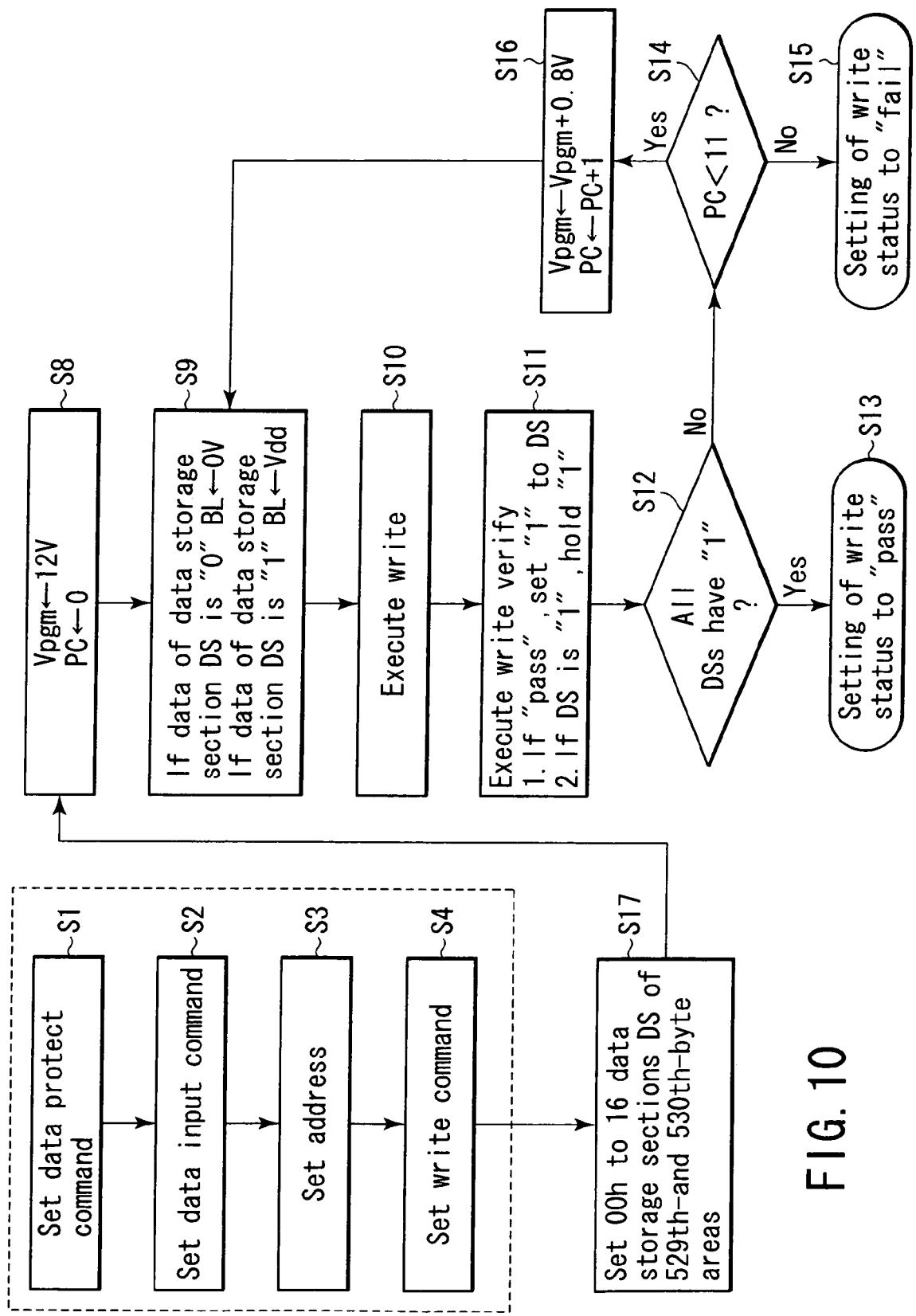
FIG. 10 is a flowchart showing the algorithm of a data protect flag write according to the embodiment of the present invention.

FIG. 10 shows the algorithm of a data protect flag write to a selected block. "Setting a data protect flag" means here setting both the write protect flag and erase protect flag described above.

First, a data protect command from the host is received and set in the state machine 8 (S1). A data input command from the host is received and set in the state machine 8 (S2). Address data from the host is received, and the address to select a write page is set in the state machine 8 (S3). At this time, all the 532 bytes of the write data of the data storage sections DS are reset to "1"s. Since the data protect flag is written in the first page of the selected block, the address is that of the first page of the selected block. The received page address may be neglected, and a page address may be automatically internally generated in accordance with the data protect command. In this case, the data protect flag is written in the page selected by the internally generated page address.

A write command issued by the host is received and set in the state machine 8 (S4). When the write command is set, steps S8 to S17 are automatically internally activated by the state machine 8.

First, 00*h* is set in each of the 16 data storage sections DS of the 259th- and 530th-byte areas (S17). Accordingly, 00*h* data are written only in the 529th- and 530th-byte areas.

Next, steps S8 to S16 are executed. The initial value of the write voltage Vpgm is set to 12 V. The write counter PC is set to 0 (S8). When the data in the data storage section DS is "0", the write control voltage, i.e., the voltage of the bit line BL is set to 0 V. When the data in the data storage section DS is "1", the write control voltage, i.e., the voltage of the bit line BL is set to Vdd because the write is inhibited (S9). A write step is executed to apply a write pulse to the memory cells of one page by using the set write voltage Vpgm and write control voltage (S10).

The write verify is activated (S11). Data in the data storage sections DS corresponding to some of the memory transistors of one page, for which the detection results indicate "pass", are changed from "0" to "1". Memory transistors whose data storage sections DS have data "1" hold "1". It is detected whether the data in all the data storage sections DS are "1"s (S12). If YES in step S12, the write status is determined as "pass", and the processing is ended (S13). Otherwise, it is determined that the write status is not "pass". The write counter PC is checked (S14). If the value of the write counter PC is 11 or more, it is determined that the write has not been normally executed. The write status is set to "fail", and the write is ended (S15). If the value of the write counter PC is smaller than 11, the value is incremented by one. In addition, the set value of the write voltage Vpgm is increased by 0.8 V (S16). Step S9 and then the write step S10 are executed again.

Figure 11:
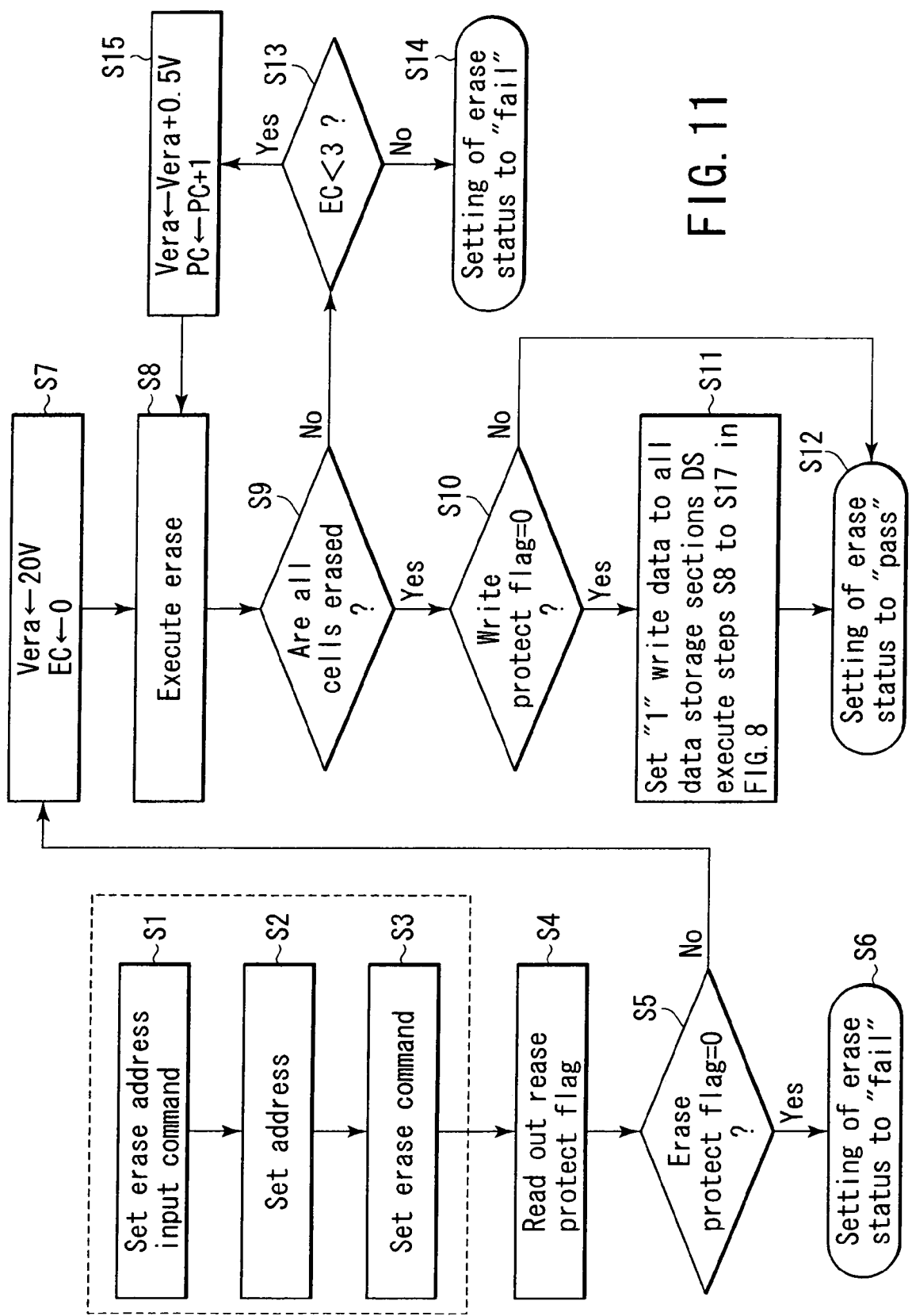
FIG. 11 is a flowchart showing the algorithm of a data erase according to the embodiment of the present invention.

FIG. 11 shows the algorithm of a data erase from the memory transistors M of a given memory block.

First, an erase address input command from the host is received and set in the state machine 8 (S1). Address data from the host is received, and the address to select an erase block is set in the state machine 8 (S2). When the erase command is set (S3), steps S4 to S15 are automatically internally activated by the state machine 8.

The page in the selected block, to which the erase protect flag is to be written, is read. The erase protect flag corresponding to one byte is read (S4). It is determined next whether the erase protect flag is set (S5). If all the data in the memory cells M corresponding to one byte are "0"s, it is determined that the erase protect flag is set. In this case, steps S7 to S15 are not executed. The erase command is not executed. The erase status is set to "fail", and the processing is ended (S6). If all the data in the memory cells M corresponding to one byte are "1"s, it is determined that no erase protect flag is set. In this case, steps S7 to S15 are executed. When the erase protect flag corresponding to one byte contains both "1" and "0", it is determined that the erase protect flag is set when four or more "0" bits are present. In this way, an error generated in the erase protect flag data is corrected in accordance with the majority theory.

When no erase protect flag is set, steps S7 to S15 are executed.

The initial value of the erase voltage Vera is set to 20 V. An erase counter EC is set to 0 (S7). An erase step is executed to apply an erase pulse to the memory cells of one block by using the set erase voltage Vera (S8).

The erase verify is activated (S9) to check whether all the memory transistors of one block are erased. If all data are erased, write protect is checked in step S10. If a write protect flag is set before the erase, it is written back (S11). The erase status is determined as "pass", and the processing is ended (S12).

If all the memory transistors of one block are not erased, it is determined that the erase status is not "pass". The erase counter EC is checked (S13). If the value of the erase counter EC is 3 or more, it is determined that the erase has not been normally executed. The erase status is set to "fail", and the erase is ended (S14). If the value of the erase counter EC is smaller than 3, the value is incremented by one. In addition, the set value of the erase voltage Vera is increased by 0.5 V (S15). The erase step S8 is executed again.

Figure 12:
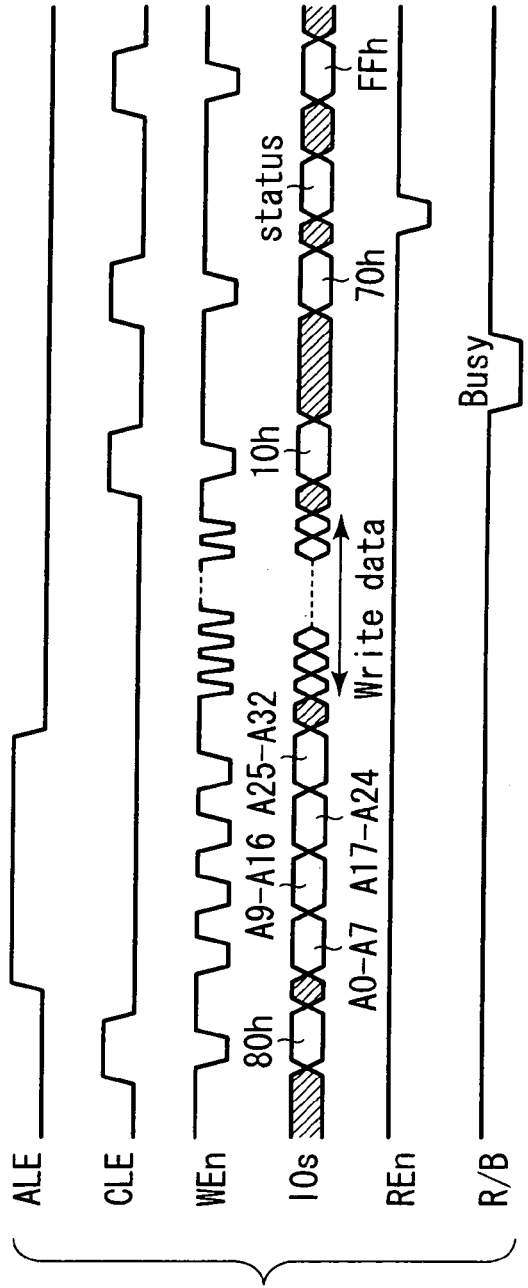
FIG. 12 is a timing chart showing the waveforms of control signals in the data write shown in FIG. 7.

FIG. 12 shows the input/output waveforms of the interface section in the data write corresponding to FIG. 7. Signals ALE, CLE, WEn, REn, and R/B are connected to the command interface 7. A data input/output signal IOs has an 8-bit width and is connected to the data input/output buffer 6.

First, a data input command 80h is input to the data input/output buffer 6. At this time, the data is received at the leading edge of the signal WEn and regarded as command data because the signal CLE is at H. Next, the signal ALE goes high. Address data to select a write page is received at the leading edge of the signal WEn. Subsequently, write data corresponding to one page is received. When a write command 10h is input, steps S5 to S16 shown in FIG. 7 are automatically executed. At this time, the command interface 7 sets the ready signal R/B low to notify an external device that processing for the write is being internally executed.

After the end of the write, when a status read command 70h is input, the external host can read the write status. This processing is activated at the trailing edge of the signal REn so that the write status is output onto the data input/output signal IOs. A command FFh is a reset command which initializes the flash memory of this embodiment. This command need not always be input after the write operation.

Figure 13:
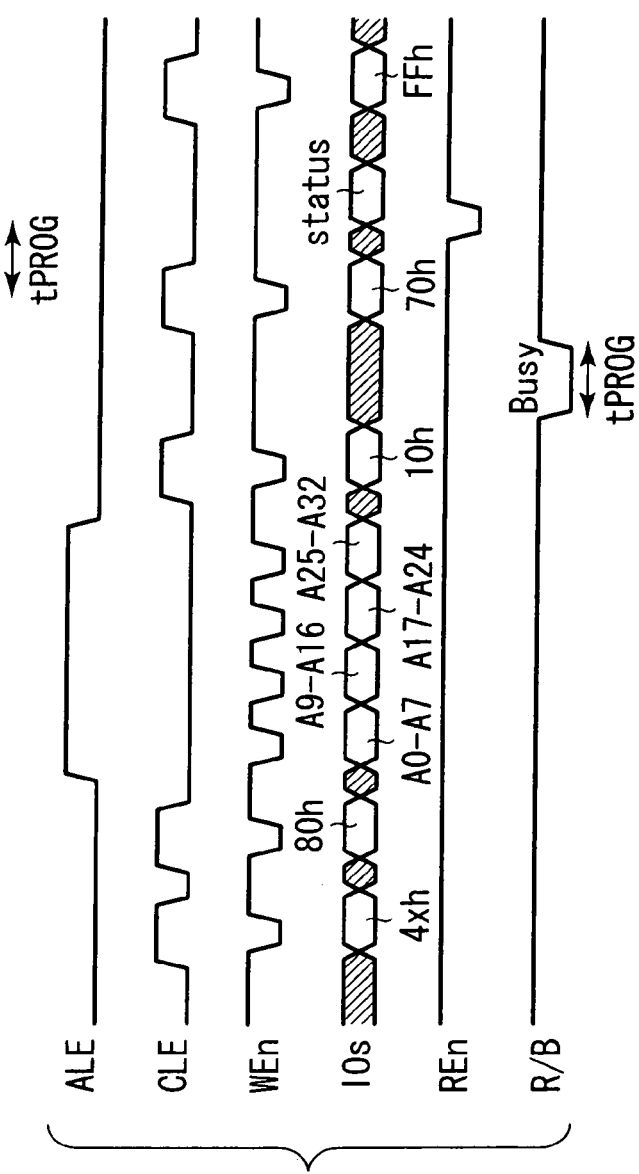
FIG. 13 is a timing chart showing the waveforms of control signals in the protect flag writes shown in FIGS. 8, 9, and 10.

FIG. 13 shows the input/output waveforms of the interface section in the protect flag write corresponding to FIG. 7.

First, a protect command 4xh (x=1, 2, 3) is input. A write protect flag is 41h, an erase protect flag is 42h, and a data protect command is 43h. Next, the data input command 80h is input. Address data to select a block to be protected is received. Subsequently, when the write command 10h is input, steps S8 to S17 shown in FIG. 8, 9, or 10 are automatically executed. At this time, the command interface 7 sets the ready signal R/B low to notify an external device that processing for the protect flag write is being internally executed.

After the end of the write, when the status read command 70h is input, the external host can read the write status. This processing is activated at the trailing edge of the signal REn so that the write status is output onto the data input/output signal IOs. The command FFh is a reset command which initializes the flash memory of this embodiment. This command need not always be input after the protect flag write operation.

Figure 14:
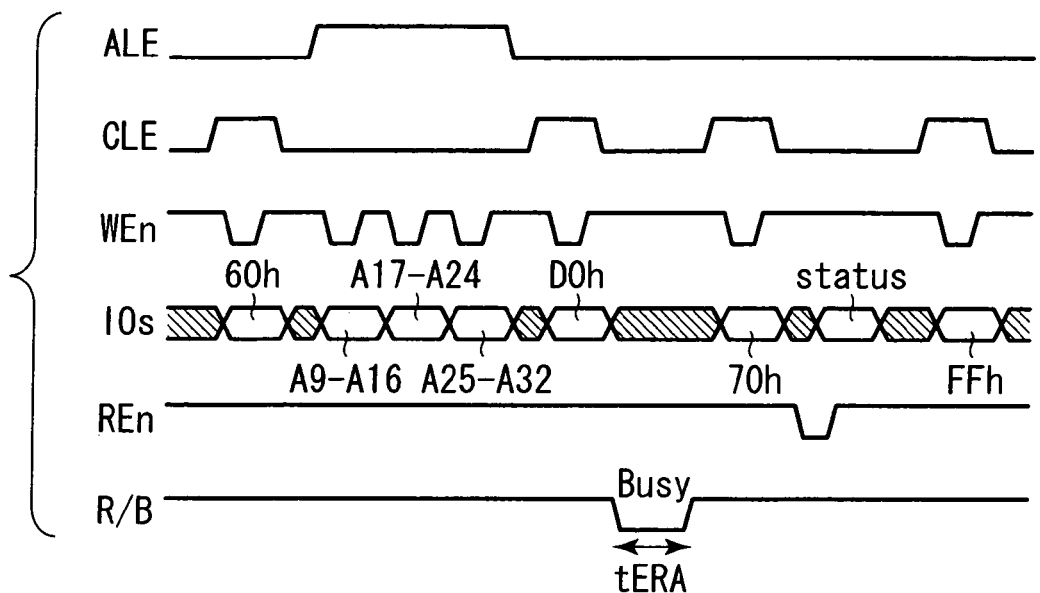
FIG. 14 is a timing chart showing the waveforms of control signals in the data erase shown in FIG. 11.

FIG. 14 shows the input/output waveforms of the interface section in the data erase corresponding to FIG. 11.

First, an address input command 60h is input. Address data to select a block to be erased is received. Subsequently, when a write command D0h is input, steps S4 to S13 shown in FIG. 11 are automatically executed. At this time, the command interface 7 sets the ready signal R/B low to notify an external device that processing for the erase is being internally executed.

After the end of the erase, when the status read command 70h is input, the external host can read the erase status. This processing is activated at the trailing edge of the signal REn so that the erase status is output onto the data input/output signal IOs. The command FFh is a reset command which initializes the flash memory of this embodiment. This command need not always be input after the erase operation.

Figure 15:
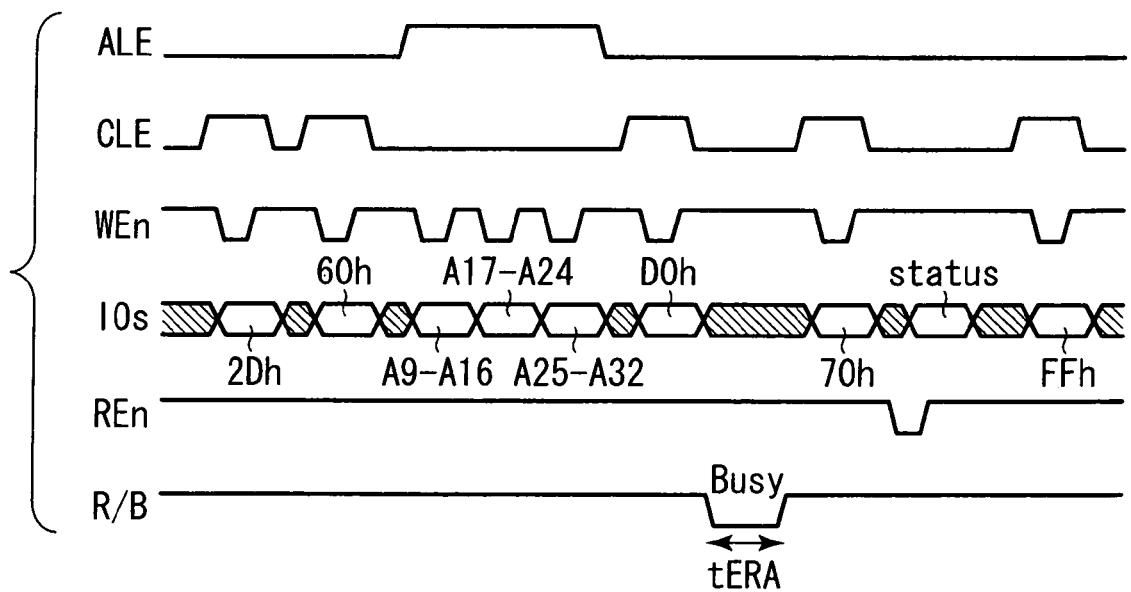
FIG. 15 is a timing chart showing the waveforms of control signals in erasing the protect flag as a modification of FIG. 14.

FIG. 15 shows a modification of FIG. 14 and the input/output waveforms of the interface section in the data erase. FIG. 15 shows a function of erasing the write and erase protect flags.

Figure 19:
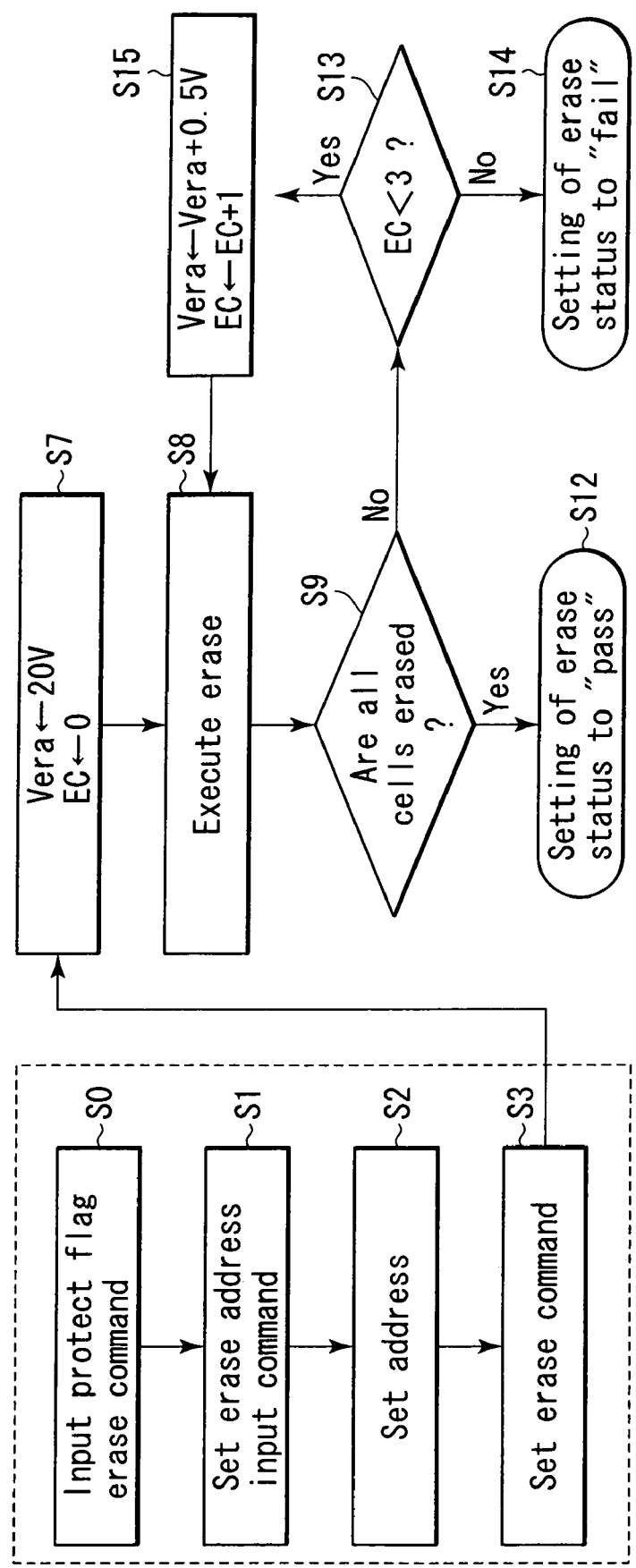
FIG. 19 is a flowchart showing the algorithm of the protect flag erase, corresponding to FIG. 15, according to the embodiment of the present invention.

First, a protect flag erase command 2Dh is input. The address input command 60h is input. Address data to select a block to be erased is received. Subsequently, when the write command D0h is input, steps S4 to S15 shown in FIG. 11 are automatically executed. After input of the erase command D0h, steps S4 to S6 are omitted so that the processing jumps to step S7. The processing advances from step S9 to step S12 or S13 directly in accordance with determination. FIG. 19 shows the algorithm without steps S4, S5, S6, S10, and S11.

The command interface 7 sets the ready signal R/B low to notify an external device that processing for the erase is being internally executed. After the end of the erase, when the status read command 70h is input, the external host can read the erase status. This processing is activated at the trailing edge of the signal REn so that the erase status is output onto the data input/output signal IOs. The command FFh is a reset command which initializes the flash memory of this embodiment. This command need not always be input after the erase operation.

Figure 16:
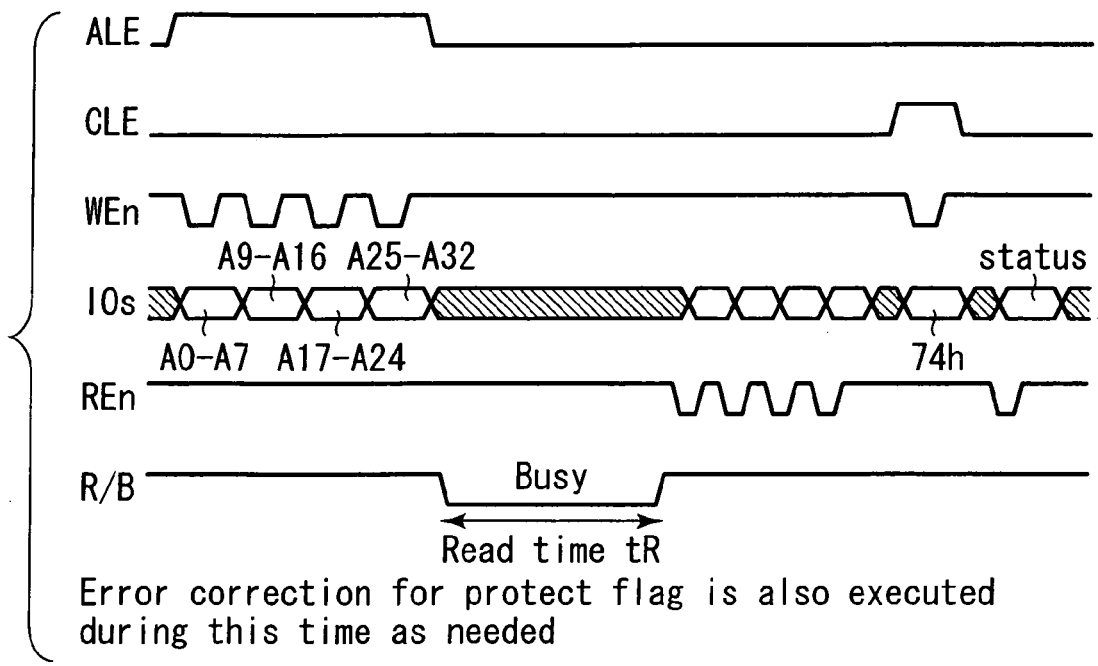
FIG. 16 is a timing chart showing the waveforms of control signals in a read according to the embodiment of the present invention.

FIG. 16 shows the input/output waveforms of the interface section so as to explain the data read and the protect flag read.

Address data of a page to be selected is received. After that, the command interface 7 sets the ready signal R/B low. During this time, the data of the selected page are automatically read to the data storage circuits DS at once and temporarily stored. If the 529th- and 530th-byte areas of the selected page are protect flag storage areas, error correction for each protect flag is executed in accordance with the majority theory.

By toggling the signal REn, the external host can receive the data read out from the data storage circuit DS. If the 529th- and 530th-byte areas of the selected page are protect flag storage areas, the external host can know whether the protect flag is set, by inputting a protect status read command 74h. For example, when the signal names of the 8-bit data input/output signal IOs are defined as IO0, IO1, IO2, IO3, IO4, IO5, IO6, and IO7, each state is expressed in the following way. (1) When only the write protect flag is set IO0, IO1, IO2, IO3, IO4, IO5, IO6, IO7=10000000 (2) When only the erase protect flag is set IO0, IO1, IO2, IO3, IO4, IO5, IO6, IO7=01000000 (3) When both the write and erase protect flags are set IO0, IO1, IO2, IO3, IO4, IO5, IO6, IO7=11000000

In this way, the external host can detect the block with the set protect flag.

Figure 17:
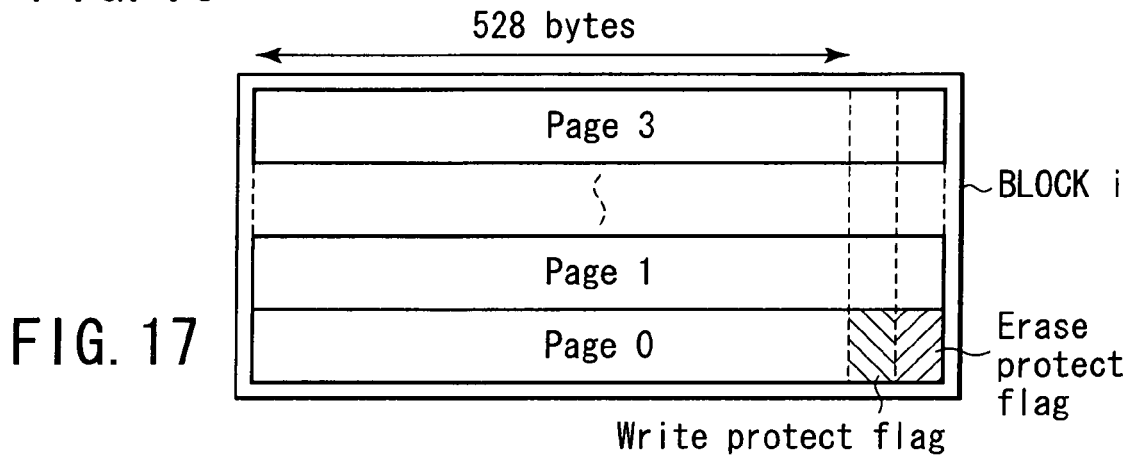
FIG. 17 is a plan view showing the position in a block where the protect flag according to the embodiment of the present invention is written.

FIG. 17 shows the logical position in each block where the protect flag is stored. Each block is constructed by eight pages. A protect flag is stored in each of the 529th- and 530th-byte areas of the first page page 0. The page need not always be the first page. A final page page 7 or a page page 3 may be used.

Figure 18:
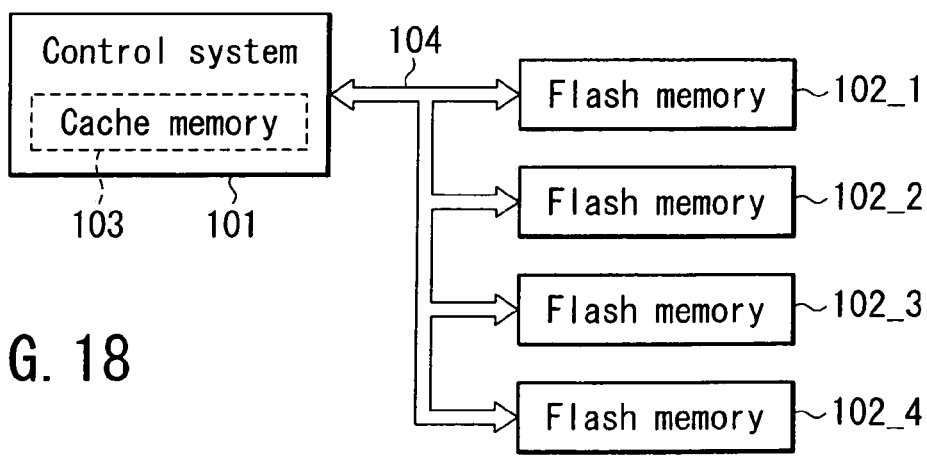
FIG. 18 is a block diagram showing a system which uses the flash memory according to the embodiment of the present invention.

FIG. 18 shows an example of a memory system which uses a flash memory 102 according to this embodiment. A control system 101 controls a plurality of flash memories 102 (102_1 to 102_4). The control system 101 may be either a semiconductor chip of certain type or a software driver of certain type. After power-on, the control system 101 reads out the protect flag of each block of each flash memory 102. The information is stored in a cache memory 103 in the control system 101. The control system 101 controls the flash memories 102 through an information input/output path 104 by using the protect flag information in the cache memory 103.

For example, the personal information of the user of the memory system is stored in the flash memory 102_1. The user instructs the memory system not to alter the information. The control system 101 sets a write or erase protect flag in the block of the flash memory 102_1 where the personal information is stored. When the system is powered next, the control system reads out the flag to detect the write- or erase-inhibited block. The memory system is operated using the remaining blocks. The memory system can be initialized by using the protect flag erase command 2Dh.

A nonvolatile semiconductor memory device according to the embodiment of the present invention comprises a plurality of memory blocks (BLOCK) constituted by electrically programmable nonvolatile semiconductor memory cells (M), a memory cell array (1) constituted by the plurality of memory blocks, an interface (6, 7) that communicates with an external device, a write circuit (2, 3, 4, 5, 8) to write data in a selected memory block in accordance with an address and a data write command input to the interface, and a read circuit (2, 3, 4, 5, 8) which reads, in accordance with the address input to the interface, a protect flag that is stored in a part of the selected memory block. The protect flag read by the read circuit can be output to the external device through the interface. When the write command is input from the interface, the write circuit executes the write command when the protect flag in the selected memory block has a first value and does not execute the write command when the protect flag has a second value.

Preferred embodiments of the present invention are as follows.

(1) The protect flag is stored in a plurality of memory cells in each memory block, and when the protect flag is read, error correction is executed in accordance with a majority theory.

(2) The write circuit writes the protect flag in the part of the selected memory block in accordance with the address and a protect flag write command input to the interface.

A nonvolatile semiconductor memory device according to the embodiment of the present invention comprises a plurality of memory blocks (BLOCK) constituted by electrically programmable nonvolatile semiconductor memory cells (M), a memory cell array (1) constituted by the plurality of memory blocks, an interface (6, 7) that communicates with an external device, an erase circuit (2, 3, 4, 5, 8) to erase data in a selected memory block in accordance with an address and an erase command input to the interface, and a read circuit (2, 3, 4, 5, 8) which reads, in accordance with the address input to the interface, a protect flag that is stored in a part of the selected memory block. The protect flag read by the read circuit can be output to the external device through the interface. When the erase command is input from the interface, the erase circuit executes the erase command when the protect flag in the selected memory block has a first value and does not execute the erase command when the protect flag has a second value.

Preferred embodiments of the present invention are as follows.

(1) The protect flag is stored in a plurality of memory cells in each memory block, and when the protect flag is read, error correction is executed in accordance with a majority theory.

(2) The device further comprises a write circuit which writes the protect flag in the part of the selected memory block in accordance with the address and a protect flag write command input to the interface.

A nonvolatile semiconductor memory device according to the embodiment of the present invention comprises a plurality of memory blocks (BLOCK) constituted by electrically programmable nonvolatile semiconductor memory cells (M), a memory cell array (1) constituted by the plurality of memory blocks, an interface (6, 7) that communicates with an external device, and a write circuit (2, 3, 4, 5, 8) to write data in a selected memory block in accordance with an address and a data write command input to the interface and write a protect flag in the selected memory block in accordance with an address and a protect flag write command input to the interface. The write circuit reads the protect flag of the selected block before the data is written in the selected block, executes the write command when the protect flag has a first value, and does not execute the write command when the protect flag has a second value.

Preferred embodiments of the present invention are as follows.

(1) The protect flag is stored in a plurality of memory cells in each memory block, and when the protect flag is read, error correction is executed in accordance with a majority theory.

A nonvolatile semiconductor memory device according to the embodiment of the present invention comprises a plurality of memory blocks (BLOCK) constituted by electrically programmable nonvolatile semiconductor memory cells (M), a memory cell array (1) constituted by the plurality of memory blocks, an interface (6, 7) that communicates with an external device, an erase circuit (2, 3, 4, 5, 8) to erase data in a selected memory block in accordance with an address and an erase command input to the interface, and a write circuit (2, 3, 4, 5, 8) to write the erase protect flag in the selected memory block in accordance with the address and an erase protect flag write command input to the interface. The erase circuit reads an erase protect flag of the selected block before the data of the selected block is erased, executes the erase command when the erase protect flag has a first value, and does not executes the erase command when the protect flag has a second value.

Preferred embodiments of the present invention are as follows.

(1) The erase protect flag is stored in a plurality of memory cells in each memory block, and when the erase protect flag is read, error correction is executed in accordance with a majority theory.

(2) The write circuit writes a write protect flag in the selected memory block in accordance with the address and a write protect flag write command input to the interface, and writes back the write protect flag after the erase command is executed.

(3) The write protect flag is stored in a plurality of memory cells in each memory block, and when the write protect flag is read, error correction is executed in accordance with a majority theory.

As described above, according to the embodiment of the present invention, the protection function of protecting data from the write or erase can be controlled for each memory block. In addition, since the type of protection and the position of the block where the protect flag is set can be read to the outside, the block can easily be managed. Furthermore, the protection function can be disabled. Hence, a flash memory which can be applied to various memory systems can be provided.

Since the presence/absence of protection is set by setting the protect flag in each block, the chip size does not increase. Address comparison for checking whether an address is protected need not be executed every time the memory is accessed. Hence, the access speed does not decrease.

Accordingly, a nonvolatile semiconductor memory device can be provided, which serves as a flash memory that can be regarded as a replacement for a magnetic storage medium, has a protection function of protecting each memory block from a write or erase, and can increase the convenience for users.

In the above embodiment, a NAND flash memory has been described as an example of a nonvolatile semiconductor memory device. However, the present invention can also be applied to a semiconductor integrated circuit device in which a NAND flash memory and logic circuit are embedded, or a semiconductor integrated circuit device called a SOC in which a system is formed in one chip. The present invention can also be applied to an IC card or memory card in which the nonvolatile semiconductor memory device is mounted on a card-shaped package or various memory systems such as a system using the memory card.

As described above, according to one aspect of this invention, a nonvolatile semiconductor memory device can be provided, which has a protection function of protecting an arbitrarily selected block from a write or erase without increasing the chip size or decreasing the access speed and can increase the convenience for users.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile semiconductor memory device comprising:
    a plurality of memory blocks constituted by electrically programmable nonvolatile semiconductor memory cells, a protect flag stored in an area of each of said plurality of memory blocks, and a write operation to each of said plurality of memory blocks being controlled by a corresponding protect flag in the memory block;
    a memory cell array constituted by the plurality of memory blocks;
    an interface configured to communicate with an external device;
    a write circuit configured to write data in a selected memory block in accordance with an address and a data write command input to the interface, when the write command is input from the interface, the write circuit executing the write command when a protect flag in the selected memory block has a first value and not executing the write command when the protect flag has a second value; and
    a read circuit configured to read, in accordance with the address input to the interface, the protect flag that is stored in an area of the selected memory block, the protect flag read by the read circuit being able to be output to the external device through the interface.

2. A device according to claim 1, wherein when the protect flag is read, error correction is executed in accordance with a majority theory.

3. A device according to claim 1, wherein the write circuit is configured to write the protect flag in the part of the selected memory block in accordance with the address and a protect flag write command input to the interface.

4. A device according to claim 1, wherein each of said plurality of memory blocks include a plurality of NAND-type memory units.

5. A device according to claim 4, wherein each of said plurality of NAND-type memory units include a plurality of memory cells connected in series.

6. A device according to claim 1, wherein each of said plurality of memory blocks include a plurality of pages, an erase operation is executed in units of blocks, and a read/write operation is executed in units of pages.

7. A device according to claim 6, wherein the protect flag is stored in a first page of said plurality of pages.

* * * * *